(12) United States Patent
Hikmet et al.

(10) Patent No.: US 11,828,457 B2
(45) Date of Patent: Nov. 28, 2023

(54) HEAT MANAGEMENT AND DEFICIENCY FOR HIGH INTENSITY LASER PUMPED LIGHT SOURCE

(71) Applicant: SIGNIFY HOLDING B.V., Eindhoven (NL)

(72) Inventors: Rifat Ata Mustafa Hikmet, Eindhoven (NL); Georges Marie Calon, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 26 days.

(21) Appl. No.: 17/769,914

(22) PCT Filed: Oct. 19, 2020

(86) PCT No.: PCT/EP2020/079339
§ 371 (c)(1),
(2) Date: Apr. 18, 2022

(87) PCT Pub. No.: WO2021/078677
PCT Pub. Date: Apr. 29, 2021

(65) Prior Publication Data
US 2022/0390090 A1 Dec. 8, 2022

(30) Foreign Application Priority Data
Oct. 22, 2019 (EP) .................................... 19204494

(51) Int. Cl.
*F21V 9/32* (2018.01)
*F21V 29/502* (2015.01)
(Continued)

(52) U.S. Cl.
CPC .................. *F21V 9/32* (2018.02); *F21V 7/05* (2013.01); *F21V 29/502* (2015.01); *F21Y 2115/30* (2016.08)

(58) Field of Classification Search
CPC .... F21V 29/502; F21V 29/505; F21V 29/713; F21V 7/05; H01S 5/0087; F21S 41/16;
(Continued)

(56) References Cited

U.S. PATENT DOCUMENTS

| 2012/0140504 A1 | 6/2012 | Fukai et al. |
| 2013/0056775 A1 | 3/2013 | Kawakami |

(Continued)

FOREIGN PATENT DOCUMENTS

| EP | 3399604 A1 | 11/2018 |
| JP | 2016100090 A | 5/2016 |

(Continued)

*Primary Examiner* — Elmito Breval
*Assistant Examiner* — Steven Y Horikoshi

(57) ABSTRACT

The invention provides a luminescent element (1000) comprising a solid luminescent body (100), wherein the solid luminescent body (100) comprises a luminescent material (200), wherein the luminescent material (200) is configured to generate luminescent material light (201) upon excitation with light having a wavelength where the luminescent material (200) is excitable, wherein the solid luminescent body (100) comprises luminescent body faces (120), wherein the luminescent element (1000) further comprises one or more reflective elements (300) associated to at least one luminescent body face (120), wherein the one or more reflective elements (300) are metallic, and wherein a surface coverage of the at least one luminescent body face (120) with the one or more reflective elements (300) is selected from the range of 5-40%.

15 Claims, 7 Drawing Sheets

(51) Int. Cl.
*F21V 7/05* (2006.01)
*F21Y 115/30* (2016.01)

(58) Field of Classification Search
CPC .. F21S 41/167; F21K 9/30; F21K 9/32; F21K 9/64
See application file for complete search history.

(56) References Cited

U.S. PATENT DOCUMENTS

| | | |
|---|---|---|
| 2014/0233210 A1 | 8/2014 | Owada |
| 2017/0153008 A1* | 6/2017 | Le Roy ................. G01T 1/2023 |
| 2018/0023775 A1 | 1/2018 | Takahashi et al. |
| 2019/0049075 A1* | 2/2019 | Ishige ..................... H04N 5/74 |
| 2019/0137062 A1 | 5/2019 | Lee et al. |
| 2019/0219248 A1 | 7/2019 | Patent et al. |
| 2020/0386386 A1* | 12/2020 | Murai ....................... F21S 2/00 |

FOREIGN PATENT DOCUMENTS

| | | | |
|---|---|---|---|
| WO | 2006054203 A1 | 5/2006 | |
| WO | 2017115778 A1 | 7/2017 | |

* cited by examiner

HEAT MANAGEMENT AND DEFICIENCY FOR HIGH INTENSITY LASER PUMPED LIGHT SOURCE

CROSS-REFERENCE TO PRIOR APPLICATIONS

This application is the U.S. National Phase application under 35 U.S.C. § 371 of International Application No. PCT/EP2020/079339, filed on Oct. 19, 2020, which claims the benefit of European Patent Application No. 19204494.9, filed on Oct. 22, 2019. These applications are hereby incorporated by reference herein.

FIELD OF THE INVENTION

The invention relates to a luminescent element comprising a solid luminescent body as well as to a light generating device comprising such luminescent element.

BACKGROUND OF THE INVENTION

Light conversion packages are known in the art. US2019/0219248, for instance, describes a lighting system comprising a light source that produces a beam; a light conversion block positioned to receive the focused or collimated beam from the light source as incident light, the light conversion block converting a portion of the incident light to converted light having a spectral distribution that differs from a spectral distribution of the incident light; a substrate; and an interconnector attaching the light conversion block to the substrate, wherein: the interconnector minimizes a thermal resistance between the light conversion block and the substrate; and the interconnector and the substrate together provide a reflectivity that is greater than 85% for reflecting the incident light and the converted light away from the lighting system, wherein the interconnects comprises a glue layer between the light conversion block and the substrate, and wherein the glue layer is less than 2 micron thick, and wherein the glue layer comprises silicone glue.

SUMMARY OF THE INVENTION

While white LED sources can give intensity 300 lm/mm$^2$ whereas static phosphor converted laser white sources can give 20.000 lm/mm$^2$. Ce doped garnets (e.g. YAG, LuAG) may be the most suitable luminescent convertors which can be used for pumping with a blue laser light as garnet matrix has the highest chemical stability and at low Ce concentrations (below 0.5%) temperature quenching occurs above 200° C. Furthermore, emission from Ce has a very fast decay time so that optical saturation can be avoided.

In embodiments, phosphor ceramics with a size ranging from e.g. 0.04-16 mm$^2$ can be used. However, one of the problems which appear to be associated with such light sources is the heat management of the ceramic phosphor. In order to induce good heat sinking of the phosphor, especially when it is used in the reflective mode, it seems desirable to be soldered onto a heat sink. However, we found that when a reflector, such as aluminum or silver, is deposited directly on the ceramic phosphor, reflectivity becomes significantly reduced. Hence, it is an aspect of the invention to provide an alternative light generating device or light conversion package, which preferably further at least partly obviates one or more of above-described drawbacks. The present invention may have as object to overcome or ameliorate at least one of the disadvantages of the prior art, or to provide a useful alternative.

Surprisingly, it has been found that when only a fraction of the phosphor is covered with reflective metal for soldering onto a reflective heat sink, a reflectivity can still be high. In the case of a metallic heat sink, it might be useful to provide it with a highly reflective metallic layer. In this way, the size of the area with lower reflectivity is minimized so that light from the areas without metal can go through the (ceramic) phosphor and get reflected from the heat sink for obtaining high reflectivity while there can also be good thermal contact between the heat sink and the soldered ceramic phosphor. In this way, a good thermal management as well as a high reflectivity can be provided.

In a first aspect, the invention provides a luminescent element comprising a solid luminescent body ("luminescent body" or "body"), wherein the solid luminescent body comprises a luminescent material. Especially, the luminescent material is configured to generate luminescent material light upon excitation with light having a wavelength where the luminescent material is excitable. Further, the solid luminescent body comprises one or more, especially a plurality of (luminescent body) faces. Further, the luminescent element comprises one or more reflective elements associated to at least one luminescent body face. Especially, the one or more reflective elements are metallic. Further, in specific embodiments a surface coverage of the at least one luminescent body face with the one or more reflective elements is selected from the range of 5-40%, even more especially selected from the range of 10-20%. Hence, in embodiments the invention provides a luminescent element comprising a solid luminescent body, wherein the solid luminescent body comprises a luminescent material (wherein the luminescent material is configured to generate luminescent material light upon excitation with light having a wavelength where the luminescent material is excitable), wherein the solid luminescent body comprises luminescent body faces, wherein the luminescent element further comprises one or more reflective elements associated to at least one luminescent body face, wherein the one or more reflective elements are metallic, and wherein a surface coverage of the at least one luminescent body face with the one or more reflective elements is selected from the range of 5-40%.

In yet a further aspect, the invention provides a light generating device (or "lighting device" or "device") comprising (i) the luminescent element as defined herein and (ii) a light source configured to generate light source light, wherein especially the luminescent material is configured in a light receiving relationship with the light source and is configured to convert at least part of the light source light into the luminescent material light.

As indicated above, with such luminescent element (and such light generating device) it may be possible to generate (high intensity) light while also managing the temperature of the luminescent body. Reflectivity at the back side may be high, such that light is reflected back into the luminescent body, while thermal dissipation via the back side of the luminescent body may also be high when the luminescent body is associated with a high thermally conductive body via the reflective elements. Hence, the reflective elements are used to provide some reflectance as well as a coupling or basis for coupling with a thermally conductive body, which may also be reflective.

As indicated above, the luminescent element comprises a solid luminescent body, wherein the solid luminescent body comprises a luminescent material. The luminescent material is configured to generate luminescent material light upon excitation with light having a wavelength where the luminescent material is excitable. The term "luminescent material" herein especially relates to inorganic luminescent materials, which are also sometimes indicated as phosphors. These terms are known to the person skilled in the art.

In embodiments, quantum dots and/or organic dyes may be applied, and may optionally be embedded in transmissive matrices like e.g. polymers, like PMMA, or polysiloxanes, amongst others. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore, the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content. Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nanowires, etcetera. Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Especially, however, the luminescent material is an inorganic luminescent material. Further, especially the luminescent body is a ceramic body.

As indicated above, the light generating device especially further comprises a luminescent material configured to convert at least part of the light source light into luminescent material light having an emission band having wavelengths in one or more of (a) the green spectral wavelength range and (b) the yellow spectral wavelength range.

The term "luminescent material" especially refers to a material that can convert first radiation (here especially the light source light), especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion. In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex} < \lambda_{em}$), though in specific embodiments the luminescent material may comprise down-converter luminescent material, i.e. radiation of a larger wavelength is converted into radiation with a smaller wavelength ($\lambda_{ex} > \lambda_{em}$). In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials.

The term "luminescent material" herein may also refer to a material comprising a luminescent material, such as a light transmissive host comprising the luminescent material.

Especially, the luminescent material is configured to convert part of the blue light source light into luminescent material light having an emission band having wavelengths in one or more of the green and yellow. Further, especially the luminescent material light has one or more wavelengths in the range of about 500-700 nm. Further, in specific embodiments the luminescent material light has a full width half maximum (FWHM) of at least 50 nm, such as at least 75 nm, like in specific embodiments up to about 130 nm (at room temperature). A broad band may provide a higher CRI. Especially, the luminescent material light has a color point in the green or yellow, especially in the yellow. Especially, in embodiments the luminescent material light has a dominant wavelength ($\lambda_{d1}$) selected from the spectral wavelength range of 540-580 nm, more especially selected from the spectral wavelength range of 555-580 nm. Especially, at least 85% of the spectral power (in Watt) of the luminescent material light, such as at least 90%, is within the range of 500-700 nm. Hence, especially the luminescent material is configured to emit luminescent material light at least having one or more wavelengths in the yellow.

Especially good results in terms of CRI and CCT range appear to be achievable with cerium doped garnet type materials. Hence, in specific embodiments the luminescent material comprises a luminescent material of the type $A_3B_5O_{12}$:Ce, wherein A in embodiments comprises one or more of Y, La, Gd, Tb and Lu, and wherein B in embodiments comprises one or more of Al, Ga, In, and Sc, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$.

Ce in garnets is substantially or only in the trivalent state, as is known to the person skilled in the art.

In specific embodiments the luminescent material comprises $(Y_{x1-x2-x3}A'_{x2}Ce_{x3})_3(Al_{y1-y2}B'_{y2})_5O_{12}$, wherein $x1+x2+x3=1$, wherein $x3>0$, wherein $0<x2+x3\leq0.2$, wherein $y1+y2=1$, wherein $0\leq y2\leq0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially such luminescent materials may have a suitable spectral distribution (see however below), have a relatively high efficiency, have a relatively high thermal stability, and allow a high CRI (in combination with the light source light and the second source of light (and the optical filter)).

In specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3\leq0.1$, and wherein $0\leq y2\leq0.1$. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein $x1+x3=1$, and wherein $0<x3\leq0.2$, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3\leq0.2$, wherein $y1+y2=1$, wherein $0\leq y2\leq0.2$. Especially, x3 is selected from the range of 0.001-0.1. Note that in embodiments $x2=0$. Alternatively or additionally, in embodiments $y2=0$.

In specific embodiments, A may especially comprise at least Y, and B may especially comprise at least Al.

In yet further embodiments, in addition to the luminescent material, the light generating device may also comprise one or more further luminescent materials, especially configured to convert part of one or more of the light source light and second source of light into further luminescent material light.

Instead of the term "luminescent body", and similar terms, also the term "light transmissive body", and similar terms, may be applied, as the luminescent body is also transmissive for the first luminescent material light. Further, as indicated above, especially the luminescent body is a ceramic body. The term "ceramic body" may refer to a body of sintered (inorganic) material, i.e. a sintered polycrystalline material. In alternative embodiments, term "ceramic body" may refer to a single crystal.

As indicated above, the light generating system especially comprises in embodiments a luminescent body. The luminescent body may comprise (N) side faces (over at least part of the length L), wherein $N\geq3$. Hence, especially the luminescent body has a cross-sectional shape that is square (N=4), rectangular (N=4), hexagonal (N=6), or octagonal (N=8), especially rectangular. Would the luminescent body have a circular cross-section, N may be considered ∞.

The (elongated) body includes a first end or first face, in general configured perpendicular to one or more of the (n) side faces and a second end or second face, which may be configured perpendicular to one or more of the side faces, and thus parallel to the first face, but which also may be configured under an angle unequal to 90° and unequal to 180°. Hence, in embodiments in specific embodiments the radiation exit window has an angle unequal to 0° and unequal to 180° with one or more of the one or more side faces, especially all of the side faces. Note that the angle α may differ per for different side faces. For instance, a slanted radiation exit window of a bar shaped elongated body may have an angle of α1 with a first side face, an angle α2=180°−α1 with a second side face, and angles of 90° with the two other side faces. The (elongated) luminescent body may thus in embodiments include (N) side faces, which comprise a first side face, comprising a radiation input face, and a second side face configured parallel to the first side face, wherein the side faces define a height (H). The first and the second side face are configured parallel with luminescent body material in between, thereby defining the width of the luminescent body. The radiation input face is at least part of the first face which may be configured to receive the light source light. The (elongated) luminescent body further comprises a radiation exit window bridging at least part of the height (H) between the first side face and the second side face. Especially, the radiation exit window is comprised by the second face. Further embodiments are also elucidated below. As indicated above, in embodiments the radiation exit window and the radiation input face have an angle (α) unequal to 0° and unequal to 180°. Yet further, as also indicated above in embodiments the radiation exit window has an angle unequal to 0° and unequal to 180° with one or more of the one or more side faces.

The light transmissive body has light guiding or wave guiding properties. Hence, the light transmissive body is herein also indicated as waveguide or light guide. As the light transmissive body is used as light concentrator, the light transmissive body is herein also indicated as light concentrator. The light transmissive body will in general have (some) transmission of one or more of (N)UV, visible and (N)IR radiation, such as in embodiments at least visible light, in a direction perpendicular to the length of the light transmissive body. Without the activator (dopant) such as trivalent cerium, the internal transmission in the visible might be close to 100%.

The transmission of the light transmissive body for one or more luminescence wavelengths may be at least 80%/cm, such as at least 90%/cm, even more especially at least 95%/cm, such as at least 98%/cm, such as at least 99%/cm. This implies that e.g. a 1 $cm^3$ cubic shaped piece of light transmissive body, under perpendicular irradiation of radiation having a selected luminescence wavelength (such as a wavelength corresponding to an emission maximum of the luminescence of the luminescent material of the light transmissive body), will have a transmission of at least 95%. Hence, the luminescent body is herein also indicated "light transmissive body", as this body is light transmissive for the luminescent material light. Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses. In embodiments, an anti-reflection coating may be applied to the luminescent body, such as to suppress Fresnel reflection losses (during the light incoupling process). In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction. The transmission can be determined by providing light at a specific wavelength with a first intensity to the light transmissive body under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The light transmissive body may have any shape, such as beam (or bar) like or rod like, however especially beam like (cuboid like). The light transmissive body, such as the luminescent concentrator, might be hollow, like a tube, or might be filled with another material, like a tube filled with water or a tube filled with another solid light transmissive medium. The invention is not limited to specific embodiments of shapes, neither is the invention limited to embodiments with a single exit window or outcoupling face. Below, some specific embodiments are described in more detail. Would the light transmissive body have a circular cross-section, then the width and height may be equal (and may be defined as diameter). Especially, however, the light transmissive body has a cuboid like shape, such as a bar like shape, and is further configured to provide a single exit window.

Especially, in embodiments the light transmissive body comprises a radiation input face, configured in a light receiving relationship with the first light source, and a radiation exit face. Especially, in embodiments the radiation input face and the radiation exit face are not the same part of the light transmissive body, though it is not excluded that the same face may be used for providing the radiation input face and the radiation exit face. In specific embodiments, the radiation exit face and the radiation input face are comprised by different faces of the light transmissive body (see further also below). However, herein also embodiments are described wherein the same face is used as radiation input face and radiation exit face.

Hence, the light transmissive body is especially transmissive for at least part of the light source light propagating from the radiation input face to the radiation exit face. Further, the light transmissive body is especially further configured to convert part of the light source light propagating through the light transmissive body into first luminescent material light. Light transmissive body are known in the art, such as e.g. described in WO2006/054203, which is incorporated herein by reference. Hence, as indicated above, especially the transmissive body may be a ceramic body. In general, the ceramic body will be self-supporting.

As indicated above, the light transmissive body is especially configured to convert part of the (first) light source light propagating through the light transmissive body into first luminescent material light having a first luminescent material light spectral power distribution differing from the first spectral power distribution of the first light source light. The first luminescent material light may especially be due to down conversion, see also above.

In a specific embodiment, the light transmissive body may especially have an aspect ratio larger than 1, i.e. the length is larger than the width. In general, the light transmissive body is a rod, or bar (beam), or a rectangular plate, though the light transmissive body does not necessarily have a square, rectangular or round cross-section. In general, the light source is configured to irradiate one (or more) of the longer faces (side edge), herein indicated as radiation input face, and radiation escapes from a face at a front (front edge), herein indicated as radiation exit window. The light source(s) may provide radiation to one or more side faces, and optionally an end face. Hence, there may be more than one radiation input face. The generally rod shaped or bar shaped light transmissive body can have any cross-sectional shape, but in embodiments has a cross section the shape of a square, rectangle, round, oval, triangle, pentagon, or hexagon. The radiation exit window may especially have an angle unequal to 0° and unequal to 180° with the radiation input face, such as angle(s) of 90°. Further, in specific embodiments the radiation exit window has an angle unequal to 0° and unequal to 180° with one or more of the one or more side faces, such as angle(s) of 90°. Generally, the (ceramic or crystal) bodies are cuboid. In specific embodiments, the body may be provided with a different shape than a cuboid, with the light input surface having somewhat the shape of a trapezoid. By doing so, the light flux may be even enhanced, which may be advantageous for some applications. Hence, in some instances (see also above) the term "width" may also refer to diameter, such as in the case of a light transmissive body having a round cross section.

In (other) embodiments, the body further has a lateral dimensions width or length (W or L) or diameter (D) and a thickness or height (H). In embodiments, (i) D≥H or (ii) and W≥H and/or L≥H. The luminescent tile may be transparent or light scattering. In embodiments, the tile may comprise a ceramic luminescent material. In specific embodiments, L≤10 mm, such as especially L≤5 mm, more especially L≤3 mm, most especially L≤2 mm. In specific embodiments, W≤10 mm, such as especially W≤5 mm, more especially W≤3 mm, most especially W≤2 mm. In specific embodiments, H≤10 mm, such as especially H≤5 mm, more especially H≤3 mm, most especially H≤2 mm. In specific embodiments, D≤10 mm, such as especially D≤5 mm, more especially D≤3 mm, most especially D≤2 mm. In specific embodiments, the body may have in embodiments a thickness in the range 50 μm-1 mm. Further, the body may have lateral dimensions (width/diameter) in the range 100 μm-10 mm. In yet further specific embodiments, (i) D>H or (ii) W>H and W>H. Especially, the lateral dimensions like length, width, and diameter are at least 2 times, like at least 5 times, larger than the height. Hence, in embodiments the luminescent body may have a plate-like shape.

As indicated above, the luminescent body may comprise ceramic material. Especially, the luminescent body is defined by ceramic material. Hence, in embodiments the ceramic material may comprise luminescent material or may be luminescent material.

Especially, the ceramic material is obtainable by a sintering process and/or a hot pressing process, optionally followed by an annealing in an (slightly) oxidizing atmosphere. The term "ceramic" especially relates to an inorganic material that is—amongst others—obtainable by heating a (poly crystalline) powder at a temperature of at least 500° C., especially at least 800° C., such as at least 1000° C., like at least 1400° C., under reduced pressure, atmospheric pressure or high pressure, such as in the range of $10^{-8}$ to 500 MPa, such as especially at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing). A ceramic especially has density that is at least 90% (or higher, see below), such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles). The heating under elevated pressure, such as HIP, may e.g. be performed in an inert gas, such as comprising one or more of $N_2$ and argon (Ar). Especially, the heating under elevated pressures is preceded by a sintering process at a temperature selected from the range of 1400-1900° C., such as 1500-1800° C. Such sintering may be performed under reduced pressure, such as at a pressure of $10^{-2}$ Pa or lower. Such sintering may already lead to a density of in the order of at least 95%, even more especially at least 99%, of the theoretical density. After both the pre-sintering and the heating, especially under elevated pressure, such as HIP, the density of the light transmissive body can be close to the density of a single crystal. However, a difference is that grain boundaries are available in the light transmissive body, as the light transmissive body is polycrystalline. Such grain boundaries can e.g. be detected by optical microscopy or SEM. Hence, herein the light transmissive body especially refers to a sintered polycrystalline having a density substantially identical to a single crystal (of the same material). Such body may thus be highly transparent for visible light (except for the absorption by the light absorbing species such as especially $Ce^{3+}$).

The luminescent body may also be a crystal, such as a single crystal. Such crystals can be grown/drawn from the melt in a higher temperature process. The large crystal, typically referred to as boule, can be cut into pieces to form the light transmissive bodies. The polycrystalline garnets mentioned above are examples of materials that can alternatively also be grown in single crystalline form.

After obtaining the light transmissive body, the body may be polished. Before or after polishing an annealing process (in an oxidative atmosphere) may be executed, especially before polishing. In a further specific embodiment, the annealing process lasts for at least 2 hours, such as at least 2 hours at least 1200° C. Further, especially the oxidizing atmosphere comprises for example $O_2$.

The light generating device is especially configured to generate device light. the device light may comprise at least (part of the) luminescent material light.

As indcted above, at least part of the light source light is converted into the luminescent material light. Hence, in embodiments part of the light source light is converted into luminescent material light (with a conversion efficiency of the luminescent material; the rest of the energy may lead to heating of the luminescent material). In such embodiments, the device light may comprise both luminescent material light and light source light. In other embodiments, essentially all the light source light may be converted into luminescent material light. In such embodiments, the device light may essentially consist of the luminescent material light. Of course, the light generating device may also comprise other light source, of which light source light is partly or even essentially not converted by the luminescent material, or even bypasses the luminescent material. In such embodiments, the device light may also comprise such (other) light source light.

Above, some possible materials in relation to the luminescent body are described. Also some shapes are described. In specific embodiments, the solid luminescent body comprises an elongated light transmissive body, wherein the solid luminescent body is light transmissive for at least part of the luminescent material light. In alternative embodiments, the solid luminescent body comprises a plate-like shaped light transmissive body, wherein the solid luminescent body is light transmissive for at least part of the luminescent material light.

Especially, the solid luminescent body comprises a ceramic body or a single crystal. Hence, in specific embodiments the solid luminescent body is a ceramic body. The term "ceramic body" may also refer to a multilayer ceramic body, e.g. comprising layers with different luminescent materials.

The solid luminescent body comprises luminescent body faces. As indicated above, the luminescent body may have different cross-sectional shapes, of which a body with two or more side faces, especially at least three side faces, like four side faces (N=4, see also above), may be most desirable in the context of the present invention.

Especially, the luminescent body is to be thermally coupled with a thermally conductive body, such as a heat sink. Such element may guide away heat from the luminescent body which is generated while exciting the luminescent body met excitation light. The lower the temperature, the higher the efficiency of the luminescent material. Hence, a good thermal dissipation from heat from the luminescent material is desirable. Further, it is desirable that excitation light that penetrates through the luminescent body is reflected back into the body and is not lost. Hence, a reflector at one or more faces, especially a face opposite of the face that is irradiated with the excitation light, may be desirable. Yet further, it is desirable that luminescent material light that penetrates through the luminescent body is reflected back into the body and is not lost at faces where it should not escape. Hence, a reflector at one or more faces, especially there where the luminescent body is in thermal contact with a thermally conductive body is also desirable. Hence, especially a light reflective thermally conductive body is chosen.

As indicated above, a physical connection with a the heatsink may lead to a reduction in reflection, and thus yield. A physical connection with the heatsink, or other thermally conductive body, may lead to a loss of light source light and/or luminescent material light. Hence, the present invention proposes a compromise between light loss and thermal dissipation, by using reflective elements as thermal connectors. Hereby, the thermal pathway is created while optical coupling is reduced. Further, the reflection properties of the heatsink may be optimized and may less depend on conditions related to associating the luminescent body and the thermal conductive element.

Hence, the luminescent element may further comprise one or more reflective elements associated to at least one luminescent body face. Especially, the one or more reflective elements are metallic. This may guarantee a high thermal conduction and may also facilitate association, such as by soldering. However, other reflective elements may also be used. Especially, the reflective elements thus have a relatively high thermal conductivity.

A thermally conductive material may especially have a thermal conductivity of at least about 20 W/m/K, like at least about 30 W/m/K, such as at least about 100 W/m/K, like especially at least about 200 W/m/K.

However, as indicated above, the one or more reflective elements only cover part of the luminescent body face to which they are associated. In specific embodiments, a surface coverage of the at least one luminescent body face with the one or more reflective elements is selected from the range of 5-40%.

Especially, the reflective elements are solderable (to the thermally conductive body). Either the reflective elements are solderable, or an intermediate material is provided, that is associated to the reflective element and that is solderable.

The reflective elements may be associated to more than one luminescent body face. Especially, however, when there are N+2 luminescent body faces (with N side faces), up to N+1 luminescent body faces may comprise the one or more reflective elements. Hence, especially at least one luminescent body face is not associated to one or more reflective elements. The one or more luminescent body faces that are not associated to one or more reflective elements may be used to couple light source light into the luminescent body. When there are luminescent body faces not used for light source light incoupling and/or luminescent light outcoupling, and are not associated to one or more of the reflective elements, such one or more faces may be provided with a reflector. Such reflector may cover the respective face with a coverage over e.g. 50%, such as at least 80%, up to even about 100%.

Especially, in embodiments a single luminescent body face may by associated to the one or more reflective elements (see further also below).

The conditions in relation to coverage and shape etc. in relation to the reflective element are herein defined relative to a single face. When more faces comprise such reflective elements, for at least one face apply these conditions (like especially coverage).

Basically, there may be two types of embodiments, which may also be combined. In one type of embodiments, there may one or more shaped reflective elements. The shape may e.g. be selected from following the contour of a circle or of a rectangle or a triangle or of another polygonal (2D) shape. The shape may also be selected from a fractal shape, a meandering shape, a spiral shape. Combinations of two or more shapes may also be applied. In another type of embodiments, there are more than one reflective elements, which may especially be configured in a 2D array. The array may be regular, random, or quasi random. Combinations of different arrays may also be applied. Further combinations of these two different types of embodiments may also be applied, like e.g. an array of fractal shaped reflective elements. A 2D array of elements may be used, such as having a rectangular cross-section. Also a 1D array of elements may be used which have the shape of elongated element, such as a line pitch. Such line elements may have a length in the range of a width or the length of the face to which they are applied.

In specific embodiments, at any edge point (P) from one of the one or more reflective elements, in a plane parallel to the at least one luminescent body face to which the one of the one or more reflective elements is associated, a circle having a first radius r1 touches at least another part of the same reflective element or another part of another reflective element, wherein 10 μm≤r≤500 μm, like at maximum 300 μm. Especially, this indicates that starting from an arbitrary point at an edge of a reflective element a distance through matter (solid matter, but especially vacuum or gas) other than the metallic material of the reflective element(s) to another point at an edge of the same or another reflective element is no longer than 500 μm, such as no longer than 300 μm.

In alternative or additional specific embodiments, the luminescent element comprises a plurality of n reflective elements, wherein n≥2, wherein the n reflective elements have a second shortest distance (d1) between nearest neighboring reflective elements, wherein 20 μm≤d1≤500 μm, especially wherein 20 μm≤d1≤300 μm. In yet more specific embodiments, the second shortest distances (d1) are selected from the range of 50-200 μm Best results are obtained when d1≤100 μm. At too large second distances, the temperature between the reflective elements may become too high. This may lead to a reduction in the luminescence efficiency (thermal quenching).

Further, also in view of thermal management, it appears that the surface coverage is especially selected from the range of 10-20%. A too small coverage may lead to parts of the luminescent element where the temperature may rise too much. However, a too larger coverage may lead to losses due to the optical contact between the reflective element and the luminescent body.

When a plurality of reflective elements are applied, n may be at least 2. Even more especially, n≥6. For instance, in embodiments n≥16. In yet further specific embodiments, the at least one body face may comprise at least one reflective element per 40,000 μm², such as at least 2, like at least 10, and in yet further embodiments at maximum 200, such as at maximum about 160. Further, in specific embodiments the reflective elements have cross-sectional areas A1 parallel to the at least one luminescent body face of at least 25 μm², and in embodiments thus at maximum about 20% coverage.

In embodiments, the reflective elements are configured in a regular array. This may lead to a relatively even dissipation of the heat from the luminescent body to the thermally conductive body. In alternative embodiments, there may be an uneven distribution. This may a regular or (pseudo) random distribution (see also above). In specific embodiments, the reflective elements may be configured such, that at those parts that may receive the highest optical load, the coverage is larger than at those parts that may receive lower optical loads. For instance, in embodiments the at least one luminescent body face has an edge and a geometrical center, wherein the reflective elements closer to the geometrical center may have smaller shortest distances (d1) than reflective elements closer to the edge. However, in alternative solutions the reflective elements closer to the geometrical center may have larger shortest distances (d1) than reflective elements closer to the edge. Hence, in specific embodiments one or more of the following may apply: (i) the reflective elements are configured in a regular array, and (ii) the at least one luminescent body face has an edge and a geometrical center, wherein the reflective elements closer to the geometrical center have smaller shortest distances (d1) than reflective elements closer to the edge. In the latter embodiments (but also in the former embodiments), especially n≥16 (see also above).

In embodiments, the reflective elements may have an equivalent circular (cross-sectional) diameter (in a plane parallel to the at least one luminescent body face) D1, wherein 0.2*d1≤D≤0.85*d1, especially wherein 0.45*d1≤D≤0.8*d1. The equivalent circular diameter (or ECD) of an (irregularly shaped) two-dimensional shape (such as a cross-section) is the diameter of a circle of equivalent area. For instance, the equivalent circular diameter of a square with side a is $2*a*SQRT(1/\pi)$.

The reflective elements comprise reflective material, that is in contact with the luminescent body. The contact may be physical, via Van der Waals forces, via chemical binding, etc. For instance, in embodiments the one or more reflective elements are (at least partly) obtainable by vapor deposition printing on the at least one luminescent body face. Hence, at least a reflective part of the reflective elements may be obtainable via PVD or CVD printing. The reflective material may e.g. be selected from silver and/or aluminum. Hence, in embodiments the one or more reflective elements comprise one or more of silver and aluminum. These metals may provide a relatively high reflection (for visible light) and may be relatively easily be associated to the luminescent body. Hence, especially silver and/or aluminum is attached to at least one of the luminescent body faces of the luminescent body.

In order to provide the reflective element(s), whether or not in a pattern, one may have to apply the metal layer, in general in combination with a kind of patterning process as the coverage is lower than 100%. Application of a metal layer on such a scale may be done by vapor deposition e.g. chemical vapor deposition (CVD) and/or physical vapor deposition (PVD). The patterning process on such a scale may typically include lithography. The metal layer can be applied first, followed by applying a resist layer, next patterning the resist e.g. using a mask+light exposure and subsequently develop the resist, then the metal layer is etched e.g. in an etch bath. Subsequently, the resist structure is striped, leaving the patterned reflective element(s) on the surface of the luminescent body.

The photo resist layer can also be applied first, next patterning the resist e.g. using a mask+light exposure and subsequently develop the resist, then the metal layer is applied. Subsequently, the resist layer is striped with part of the metal layer, leaving the patterned reflective element(s) on the surface of the luminescent body.

Although lithography may be a very suitable process, a pattern of a polymer can also be applied e.g. by printing. In other words, lithography is in such a case not needed.

In yet further embodiments, the reflective elements may be generated by printing, such as metal (3D) printing.

As indicated above, the luminescent body is associated to a thermally conductive body. To this end, the luminescent element further comprises a thermally conductive body, especially having a thermal conductivity of at least 50 W/m/K, like at least 100 W/m/K, such as even at least 200 W/m/K. The thermally conductive body may be a heat sink or a heat spreader for lateral spreading the heat produced in the luminescent body. A heat spreader is an object that has high thermal conductivity and that is used as a bridge between a heat source and a heat exchanger (e.g. heat sink). A heat pipe can also be used for transferring the heat from the luminescent body to a heat sink where the heat is extracted.

Heatsinks are known in the art. The term "heatsink" (or heat sink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heat sink is especially designed to maximize its surface area in contact with the fluid cooling medium surrounding it. Hence, especially a heatsink may comprise a plurality of fins. For instance, the heatsink may be a body with a plurality of fins extending thereof.

A heatsink especially comprises (more especially consists of) a thermally conductive material. In embodiments, a heatsink may comprise or consist of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the heatsink may comprise or consist of aluminum oxide. The term "heatsink" may also refer to a plurality of (different) heatsinks.

As indicated above, the thermally conductive body has a thermal conduction of at least 100 W/m/K, or even at least about 200 W/m/K. Further, the thermally conductive body comprises a thermally conductive body face, wherein the solid luminescent body is associated to the thermally conductive body face via the one or more reflective elements and optionally (thermally conductive) intermediate elements between the one or more reflective elements and the thermally conductive body face. Hence, between the thermally conductive body and the luminescent body there may be one or more stacks, wherein each stack comprises an intermediate element, associated to the thermally conductive body and the reflective element, and thus the reflective element, associated to the intermediate element and the luminescent body. In alternative embodiments, the one or more reflective elements are directly associated to the thermally conductive body. Instead of the term "intermediate element", also the term intermediate material may be applied. The term "intermediate element" may also refer to a plurality of intermediate materials, which may e.g. be stacked.

The intermediate elements may comprise a solder layer. However, in other embodiments the intermediate elements may comprise a solder layer and an additional layer. Such additional layer may facilitate coupling of the solder layer to the reflective element. Hence, in specific embodiments the intermediate elements comprise a first intermediate layer and a second intermediate layer, wherein the first intermediate layer is in physical contact with the reflective element, wherein the second intermediate layer is sandwiched between the first intermediate layer and the thermally conductive body face, wherein the second intermediate layer comprises solder. In specific embodiments, the first intermediate layer comprises one or more of nickel, copper, gold, or an oxide layer, especially one or more of nickel and gold. A nickel layer and/or gold layer may be associated to the aluminum or silver. In this way, the solder can be provided to the nickel or gold layer. In this way, one or more connectors are provided between the luminescent body and the thermally conductive body. These one or more connectors have reflective properties and thermally conductive properties. One or more of $SiO_2$, TiW, $Al_2O_3$, $Si_3N_4$, Ti, $TiO_2$ are some of the materials which can be used for improving adhesion between the layers. Hence, the (first) intermediate layer may also comprise one or more of these materials. When transparent layers are used they can cover the total surface and thus they do not need to be patterned as they do not absorb/reflect light. An example of a stack is: luminescent body/20 Å Ti/2500 Å Ag/3000 Å Ni/1000 Å Au/thermally conductive body.

Solders are known to a person skilled in the art. In embodiments, the solder may comprise an indium solder. In embodiments, the solder may comprise a spelter brass solder, which is essentially pure zinc or a zinc alloy solder. In embodiments, the solder may comprise one or more of platinum solder, gold solder, and silver solder. Hence, when the reflective element comprises silver, a silver solder may be applied as connection element (or connector) between the luminescent body and the thermally conductive body, and the connection element may be provided the desired reflective properties.

Hence, the reflective elements may be comprised by connectors. Such connectors may consist of the reflective elements or may further comprise intermediate elements.

As indicated above, the second luminescent body face may be radiatively coupled with the light source. Hence, via this second luminescent body face light source light may enter the luminescent body. In specific embodiments, the second luminescent body face may be coated with an anti-reflection layer for the light source light (especially excitation light). Thus, the thickness t of the anti-reflection layer with a refractive index of $n_a$ is defined as $t=n_a*\lambda/4$. For e.g. YAG with a refractive index of about 1.8, $n_a=(1.8)^{0.5}=1.34$. Hence, for blue light (450 nm) the anti-reflection layer brought on top of YAG needs to be in the order of about 150 nm. Hence, in embodiments, the thickness t of the anti-reflection layer with a refractive index of $n_a$ is defined as $t=n_a*\lambda/4*a$, wherein a is selected from the range of 0.9-1.1. In this way, some tolerance is allowed.

Such anti-reflection layer may especially be useful in combination with the laser light source, as such laser light source may essentially provide monochromatic light.

Further, the thermally conductive body may especially be reflective. Hence, light escaping form the luminescent body and propagating from the at least one body face between reflective material of the reflective elements to the thermally conductive body may be reflected back by the thermally conductive body. For instance, when the thermally conductive body is from aluminum, or anther metal (such as in embodiments copper, especially coated with a reflective layer such as aluminum or silver), at least part of the visible light will be reflected. For improvement of the reflection, a reflective layer may be applied, or a thermally conductive body with a higher reflection may be applied. For instance, a highly reflective (Miro) reflector may be applied. Herein, the term "Miro" refers to reflective material, especially from Alanod/Westlake Metal Ind., that have a high (surface) reflectivity. Especially, such reflective material is highly specular reflective, with equal to or less than 10%, such as equal to or less than 6% diffuse reflection under perpendicular radiation, the remainder being specular reflection, especially under irradiation with visible light. Hence, the Miro reflective material may be applied (herein) as specular reflector. In specific embodiments the body holder structure may comprise AlSiMgMn. Hence, in specific embodiments the thermally conductive body comprises a reflective layer, wherein the reflective layer defines the thermally conductive body face. The reflective layer may be a support for the connectors or may be configured between the connectors.

Side surfaces of the luminescent body can also be covered by reflective metals as described above but they can also be covered by diffuse reflectors e.g. comprising particles (such as $TiO_2$ and/or $Al_2O_3$).

In this way, there is a distance between the thermally conductive body and the luminescent body (or vice versa). Especially, this distance may be such that there is thermal coupling between the luminescent body and the thermally conductive body, but especially not optical coupling. In embodiments, a third distance (d3) between the solid luminescent body and the thermally conductive body face may be selected from the range of 10-100 µm. For visible light, this distance does not allow optical coupling. Hence, via this pathway essentially no light may be lost. However, there may still be (some) thermal coupling, especially when the third distance is equal to or less than 80 µm, such as equal to or less than 50 µm.

In yet a further aspect, the invention also provides a light generating device comprising the luminescent element as described above and a light source configured to generate light source light, wherein the luminescent material is configured in a light receiving relationship with the light source and is configured to convert at least part of the light source light into the luminescent material light.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser.

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride ($Sm:CaF_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate $Nd:YCa_4O(BO_3)_3$ or Nd:YCOB, neodymium doped yttrium orthovanadate ($Nd:YVO_4$) laser, neodymium glass (Nd:glass) laser, neodymium YLF (Nd:YLF) solid-state laser, promethium 147 doped phosphate glass ($147Pm^{3+}$:glass) solid-state laser, ruby laser ($Al_2O_3$:$Cr^{3+}$), thulium YAG (Tm:YAG) laser, titanium sapphire (Ti:sapphire; $Al_2O_3$:$Ti^{3+}$) laser, trivalent uranium doped calcium fluoride ($U:CaF_2$) solid-state laser, Ytterbium doped glass laser (rod, plate/chip, and fiber), Ytterbium YAG (Yb:YAG) laser, $Yb_2O_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

As indicated above, the luminescent material is configured in a light receiving relationship with the light source. Hence, the luminescent material and the light source are optically coupled in the sense that at least part of the light source light reaches the luminescent material. Hence, the luminescent body and the light source are in embodiments optically coupled. Instead of the term "optically coupled" also the terms "radiationally coupled" or "radiatively coupled" may be used. The term "radiationally coupled" especially means that a first element and a second element are associated with each other so that at least part of the radiation emitted by the first element is received by the second element. Likewise, the light source may be radiationally coupled with the luminescent body, though in general the light source is not in optical contact, such as physical contact, with the luminescent body (see also below). The term "optical contact" and "optically coupled", similar terms, especially mean that at least part of the light (especially the luminescent material radiation) escaping from one element is at least partly received by another element. Hence, luminescent material light propagating from the radiation concentrator window irradiates optical element. The term "optical contact" may especially indicate that at least part of the light (especially the luminescent material radiation) escaping from the radiation exit window may enter the optical element with minimal losses (such as Fresnel reflection losses or TIR (total internal reflection) losses)) due to refractive index differences of these elements. Losses may be minimized by one or more of the following elements: a direct optical contact between the two elements, providing an optical coupling medium (or optically transparent interface material), such as an optical glue or an optical gel, etc., between the two elements, especially the optical coupling medium, such as an optical glue, having a refractive index higher than or equal to the lowest refractive index of the two individual elements and especially lower than or equal to the highest refractive index of the two individual elements, providing the two optical elements in close vicinity (e.g. at a distance much smaller than the wavelength of the radiation), such that the light will tunnel through the material present between the two elements, providing an optically transparent interface material between the two elements. Especially, the optically transparent interface material may have a refractive index higher than the lowest refractive index of the two individual optical elements (here the optical element and the luminescent body). The optically transparent interface material might be a liquid or a gel. In embodiments, the optically transparent interface material may also be a solid material. Further, the optical interface material, such as an optical glue, especially may have a refractive index not higher than the highest refractive index of the two individual elements. Especially, there may be no optical contact when the distance is at least equal to the wavelength of interest, more especially at least twice the wavelength of interest. In other words, there may be optical contact when the distance is at maximum about the wavelength of interest. For optical contact between the luminescent body and a light source, the wavelength of interest may e.g. be the wavelength of a peak maximum of the luminescent material light or of the light source light. Hence, in embodiments the distance between the light source and the luminescent body may be at least equal to or larger than the wavelength of a peak maximum of the luminescent material light, as optical contact may lead to light losses. Hence, the light source may be optically coupled to the luminescent body but may not be in optical contact therewith.

One or more identical light source may be radiatively coupled with the luminescent body. One or more different types of light sources, having different spectral distribution of the light source light may be radiatively coupled with the luminescent body, for instance when the luminescent body comprises different luminescent material. However, there may also be further light sources, either identical or different from the light source(s) that is (are) radiatively coupled with the luminescent body, that are not radiatively coupled with the luminescent body. Light of such one or more further light sources may bypass the luminescent body. When there are more than one light sources radiationally coupled (i.e. radiatively coupled) with the luminescent body, two or more of these may be radiatively coupled with the same face. However, also two or more of these may be radiatively coupled with different faces of the luminescent body. Hence, one or more faces may be used as incoupling faces. In embodiments, a single face is used as incoupling face (for incoupling of the light source light).

Likewise (see above), the luminescent body and the thermally conductive body are not in optical contact (see also above).

The luminescent element including the thermally conductive body may especially be useful when the luminescent body is used in the reflective mode. In this way, light source light being transmitted through the luminescent body may be reflected back into the luminescent body via the thermally conductive body (such as the above-mentioned reflective layer). Beyond that, luminescent material light escaping from the luminescent body may be reflected back via the thermally conductive body (such as the above-mentioned reflective layer).

Hence, in specific embodiments the luminescent body faces of the solid luminescent body comprise a first luminescent body face and a second luminescent body face (such as in specific embodiments opposite of the first luminescent body face) (with at least part of the luminescent material is configured between the first luminescent body face and the second luminescent body face), wherein the one or more reflective elements are associated to the first luminescent body face, and wherein the light source is radiatively coupled with the second luminescent body face.

In embodiments, the first luminescent body face and the second luminescent body face may be configured opposite of each other. In yet other embodiments, the first luminescent body face and the second luminescent body face are configured under an angle (not equal to 0° or 180° or 360°), e.g. selected from the range of 45-135°. In yet other embodiments, there may be more than one first faces each comprising one or more reflective elements. For each face comprising reflective elements, the conditions as described above apply for such face. For instance, each (individually) may have a coverage of 10-20%. The luminescent body may have N+2 luminescent body faces (with N side faces). At least one face and in embodiments at maximum N+1 faces may comprise reflective elements. The phrase "face comprising reflective elements", and similar phrases, especially indicate that such reflective elements are associated to such face.

Hence, in specific embodiments of the light generating device the light source comprises a laser light source (as indicated above), and the light generating device further comprises the thermally conductive body (as indicated above).

The light generating device may provide device light during operation. The device light may comprise especially the luminescent material and optionally also the light source light. In embodiments, the luminescent body and light source, and optionally optics, are configured such that essentially no light source light is available in a beam of light that escapes from the light generating device.

In one or more operational modes of the light generating device, the device light may be colored light. Alternatively, in one or more (other) operational modes of the light generating device, the device light may be white light.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

When more than one light source is applied, it may be possible to control the spectral distribution of the device light. For instance, light source light of a second light source may have another spectral distribution and/or the light source light of a second light source has another optical path. For instance, light source light of a second light source may be admixed with the luminescent material downstream of the luminescent body.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or iPhone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

The system, or apparatus, or device may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

Hence, in embodiments, the control system may control in dependence of one or more of an input signal of a user interface, a sensor signal (of a sensor), and a timer. The term "timer" may refer to a clock and/or a predetermined time scheme.

The luminous efficiency of the device (light) may be selected from the range of 290-370 Lm/W, such as 300-360 Lm/W.

In embodiments, the light generating device is configured to provide the luminescent light with power emitted from the exit surface of the luminescent body having a power density of 4 $W/mm^2$, especially a power density at least 7 $W/mm^2$, more especially at least 9 $W/mm^2$, even more especially at least 13 $W/mm^2$. Hence, in embodiments in an operational mode of the light generating device, the light generating device is configured to generate the luminescent material light from a radiation exit surface (or radiation exit face) of the luminescent body with a power density of at least 4 $W/mm^2$. In yet further specific embodiments, the lighting device may be configured to provide luminescent light in combination with blue and/or red laser light coming out the same surface as the luminescent light providing white light with a brightness of at least 2000 $lm/mm^2$, more especially at least 3000 $lm/mm^2$, even more especially at least 6000 $lm/mm^2$. Herein, "lm" refers to lumen.

In yet a further aspect, the invention also provides a luminaire comprising the light generating device as defined herein. The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1A:
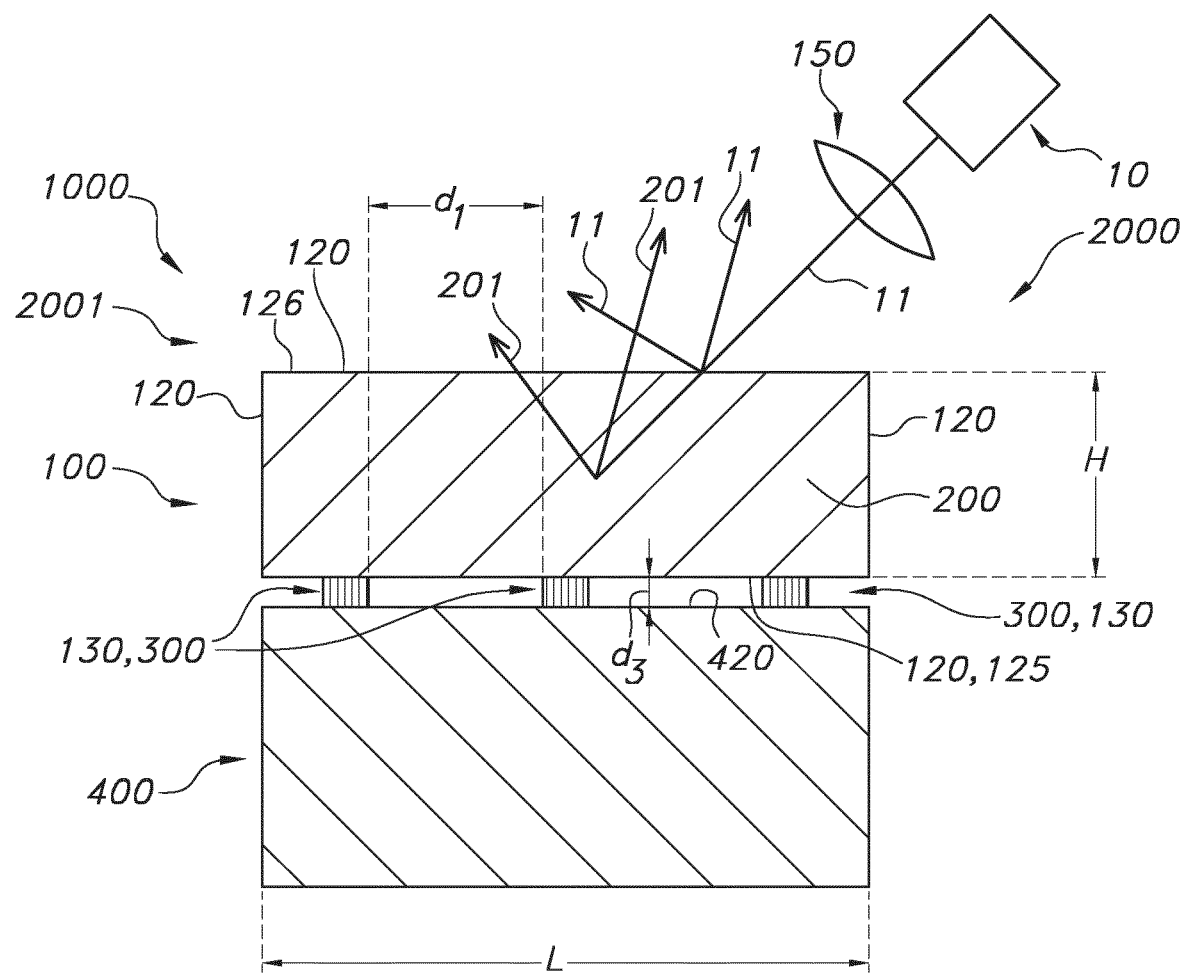
FIGS. 1a-1b schematically depict some embodiments.

FIG. 1a schematically depicts an embodiment of a luminescent element 1000 comprising a solid luminescent body 100. The solid luminescent body 100 comprises a luminescent material 200. The luminescent material 200 is configured to generate luminescent material light 201 upon excitation with light having a wavelength where the luminescent material 200 is excitable. In embodiments, the solid luminescent body (100) comprises a ceramic body.

Especially, the first luminescent material 210 may comprise a luminescent material of the type $A_3B_5O_{12}$:Ce, wherein A comprises one or more of Y, La, Gd, Tb and Lu, especially (at least) one or more of Y, Gd, Tb and Lu, and wherein B comprises one or more of Al, Ga, In and Sc, wherein A comprises at least one or more of Y, Gd, and Lu, and wherein B comprises at least Al. Further, in specific embodiments the luminescent material (200) comprises $(Y_{x1-x2-x3}A'_{x2}Ce_{x3})_3(Al_{y1-y2}B'_{y2})_5O_{12}$, wherein x1+x2+x3=1, wherein x3>0, wherein 0<x2+x3≤0.2, wherein y1+y2=1, wherein 0≤y2≤0.2, wherein A' comprises one or more elements selected from the group consisting of lanthanides, and wherein B' comprises one or more elements selected from the group consisting of Ga, In and Sc. At maximum 10% of B—O may be replaced by Si—N; B—O may thus comprise B'—O. Especially, x3 is selected from the range of 0.001-0.1, wherein 0<x2+x3≤0.1, and wherein 0≤y2≤0.1. As indicated above, in embodiments x1>0.

In specific embodiments, see also above, the light generating device 1000 comprises luminescent material, wherein at least 95 weight % of the luminescent material comprises $(Y_{x1-x2-x3}A'_{x2}Ce_{x3})_3(Al_{y1-y2}B'_{y2})_5O_{12}$. Hence, essentially all luminescent material light comprised by the device light 1001 may be based on this $(Y_{x1-x2-x3}A'_{x2}Ce_{x3})_3(Al_{y1-y2}B'_{y2})_5O_{12}$ luminescent material.

The solid luminescent body 100 comprises luminescent body faces 120. In embodiments, the luminescent body faces 120 of the solid luminescent body 100 comprise a first luminescent body face 125 and a second luminescent body face 126. In the herein depicted embodiments, the second luminescent body face 126 is opposite of the first luminescent body face 125, though this is not necessarily the case (see also FIG. 6). Hence, in specific embodiments, the second luminescent body face 126 is configured opposite of the first luminescent body face 125. Therefore, especially at least part of the luminescent material 200 is configured between the first luminescent body face 125 and the second luminescent body face 126.

The luminescent element 1000 further comprises one or more reflective elements 300 associated to at least one luminescent body face 120. Especially, the one or more reflective elements 300 are metallic. Further, especially a surface coverage of the at least one luminescent body face 120 with the one or more reflective elements 300 is selected from the range of 5-40%. As schematically depicted, the one or more reflective elements 300 are associated to the first luminescent body face 125.

Reference d1 indicates the shortest distance between nearest neighboring reflective elements 300. Reference 130 indicates connectors. The connectors comprise the reflective elements. The connectors connect the luminescent body 100 and a thermally conductive body 400. The thermally conductive body 400 may in embodiments be comprised by the luminescent element 1000; such embodiment is schematically (also) depicted in FIG. 1a.

Hence, FIG. 1a also schematically depicts an embodiment of the luminescent element 1000 further comprising a thermally conductive body 400. Especially, the thermally conductive body 400 comprises a thermally conductive body face 420. In specific embodiments, the thermally conductive body 400 has a thermal conduction of at least 10 W/m/K, more especially, however, of at least 100 W/m/K, such as especially at least 200 W/m/K. As schematically depicted, the solid luminescent body 100 is (indirectly) associated to the thermally conductive body face 420 via the one or more reflective elements 300 and optionally (thermally conductive) intermediate elements between the one or more reflective elements 300 and the thermally conductive body face 420 (see further also FIG. 2).

In embodiments, a third distance d3 between the solid luminescent body 100 and the thermally conductive body face 420 is selected from the range of 10-100 μm.

Reference H and L depict the height and length of the luminescent body 100, respectively. Note that only by way of example the length of the thermally conductive body 400 is depicted the same as the length L of the luminescent body 100. However, the length and/or width of the thermally conductive body 400 may differ from the length and/or width of the luminescent body 100.

FIG. 1a also schematically depict an embodiment of a light generating device 2000 comprising the luminescent element 1000 and a light source 10 configured to generate light source light 11. As schematically depicted, the luminescent material 200 is configured in a light receiving relationship with the light source 10 and is configured to convert at least part of the light source light 11 into the luminescent material light 201. Here, schematically the configuration is a reflective configuration. As indicated above, in embodiments the solid luminescent body 100 is light transmissive for at least part of the luminescent material light 201.

Reference 150 schematically indicates one or more optics. As indicated above, focusing may be executed with one or more optics, like (focusing) lenses. Especially, two lenses may be applied to focus the laser light source light. As schematically depicted, the light source 10 is radiatively coupled with the second luminescent body face 126. In specific embodiments, the light source 10 comprises a laser light source. In the schematically depicted embodiment of the light generating device 2000, this device 2000 thus further comprises the thermally conductive body 400.

In the embodiment schematically depicted in FIG. 1a, not all light source light 11 is converted into luminescent material light 201. A part of the light source light may be reflected at the luminescent body face which is irradiated by the light source 10 and/or a part may again escape from the luminescent body 100. Hence, device light, indicated with reference 2001, escaping from the light generating device 2000 may comprise the luminescent material light 201, but in embodiments also the (laser) light source light 10.

Figure 1B:
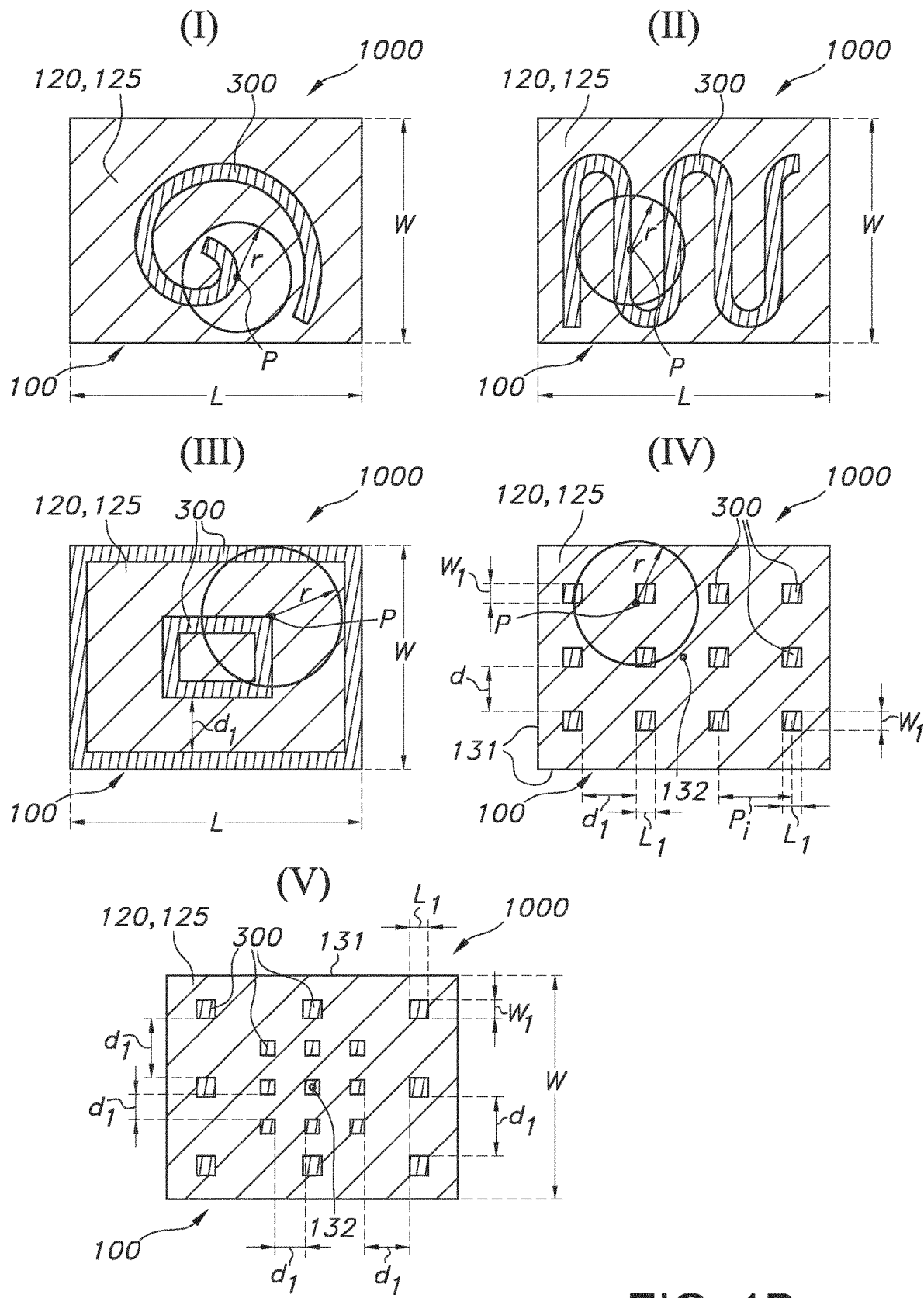

FIG. 1b schematically depict a number of possible embodiments. Especially embodiments I-II show embodiments with a single reflective element 300, and embodiment III shows an embodiment with only two reflective elements. Especially for these embodiments, the condition may apply that at any edge point P from one of the one or more reflective elements 300, in a plane parallel to the at least one luminescent body face 120 to which the one of the one or more reflective elements 300 is associated, a (virtual) circle (parallel to such face) having a first radius r1 touches at least another part of the same reflective element 300 or another part of another reflective element 300 structure. Especially, 10 µm≤r≤500 µm. Hence, the term "touches", and similar terms, may refer to embodiments where there may really be a kind of tangential touch. However, intersecting may also include touching. Embodiment III schematically depicts an embodiment wherein (one of) the reflective element(s) 300 follows a periphery of the luminescent body 100 so that after soldering the area volume between the ceramic and the heat sink is hermetically sealed (see also FIG. 1a). Embodiments IV and V schematically depict embodiments with arrays. Here, the above mentioned condition may also apply, and may optionally be broadened in the sense that a condition may apply that at any edge point P from one of the one or more reflective elements 300, in a plane parallel to the at least one luminescent body faces 120 to which the one of the one or more reflective elements 300 is associated, a circle having a first radius r1 touches at least another part of the same reflective element 300 or another part of another reflective element 300, or encloses another reflective element 300. Especially, however, the condition(s) may apply that the luminescent element 1000 comprises a plurality of n reflective elements 300, wherein n≥2, wherein the n reflective elements 300 have a second shortest distance d1 between nearest neighboring reflective elements 300, and wherein 10 µm≤d1≤500 µm, especially 20 µm≤d1≤300 µm. In embodiments, n≥6, and wherein the second shortest distances d1 are selected from the range of 50-200 µm. Further, especially the surface coverage is selected from the range of 10-20%. Embodiment IV schematically depicts an embodiment wherein the reflective elements 300 are configured in a regular array. Embodiment V schematically depicts an embodiment wherein the at least one luminescent body face 120 has an edge 131 and a geometrical center 132, wherein the reflective elements 300 closer to the geometrical center 132 have smaller shortest distances d1 than reflective elements 300 closer to the edge. Especially, n≥12, even more especially n≥16.

The at least one body face 120 may comprise at least one reflective element 300 per 40,000 µm². Further, in embodiments the reflective elements 300 may have cross-sectional areas Al parallel to the at least one luminescent body face 120 of at least 25 µm². In embodiments, IV and V, the elements 300 are indicated with first width W1 and first length L1. Note that the elements 300 do not necessarily have a rectangular cross-section, even when arranged in an array.

Figure 2:
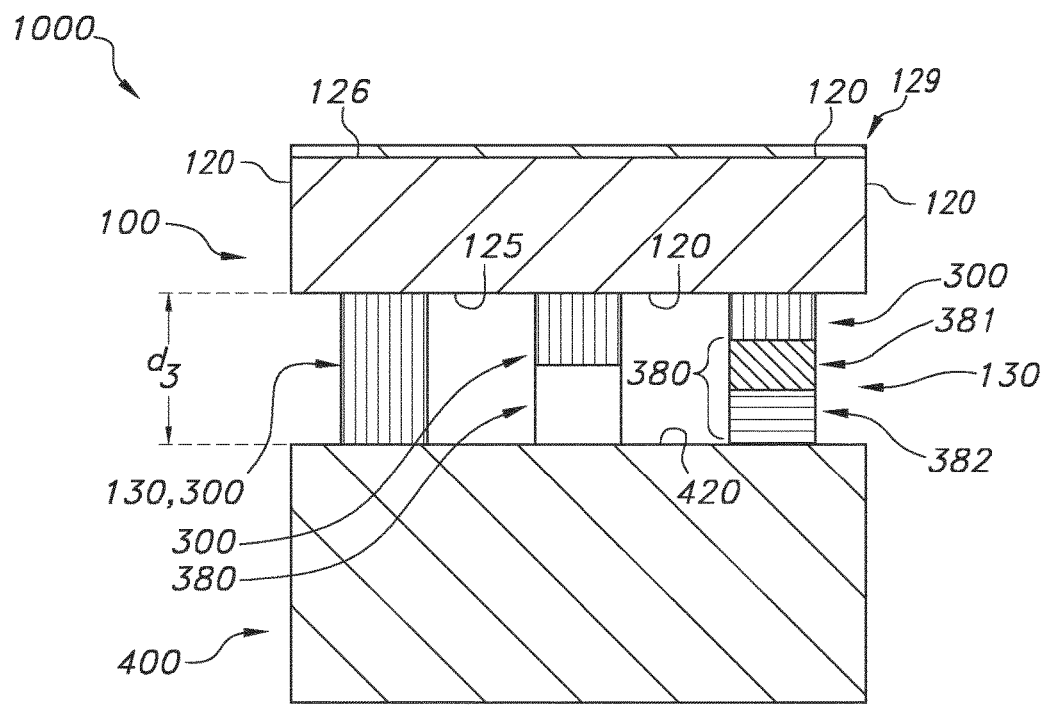
FIGS. 2-4 schematically depict some embodiments and aspects.

FIG. 2 schematically depicts an embodiment wherein the solid luminescent body 100 is associated to the thermally conductive body face 420 via the one or more reflective elements 300 and optionally intermediate elements 380 between the one or more reflective elements 300 and the thermally conductive body face 420. Especially, the one or more reflective elements 300 are obtainable by vapor deposition printing on the at least one luminescent body face 120. In embodiments, the one or more reflective elements 300 comprise one or more of silver and aluminum. For instance, Al may not be very solderable and by using an intermediate element that may well attached to the reflective element and that allows soldering, the reflective element may be attached the thermally conductive body via such intermediate element. One or more intermediate layers may also be used between reflective layer (e.g. silver) and solderable layer (gold, or copper, or nickel). Reflective Al or Silver layer, optionally with an oxide layer, may be used for enhancing reflectivity. Solderable layers on the luminescent body are then soldered onto a (highly reflective) thermally conductive body 400 (heatsink or a heat spreader or a heat pipe). In order to make the surface of the thermally conductive body 400 reflective, it may in embodiments need to be coated with a highly reflective and solderable layer such as silver.

In embodiments, the intermediate element 380 may comprise a first intermediate layer 381 and a second intermediate layer 382. The first intermediate layer 381 may be in physical contact with the reflective element 300. The first intermediate layer 381 may comprise one or more layers of (solderable) nickel, gold, and copper, and oxide layer or another layer, such as e.g. selected from the group consisting of $SiO_2$, TiW, $Al_2O_3$, $Si_3N_4$, Ti, and $TiO_2$. The second intermediate layer 382 is sandwiched between the first intermediate layer 381 and the thermally conductive body face 420. The top surface of second intermediate layer 382 is of a solderable layer and the layer above it may comprise solder. Hence, referring to FIG. 2, the intermediate layer 380 may comprise solder (middle embodiment of connector 130). In the most right embodiments, the intermediate layer comprises a second intermediate layer 382 which may comprise solder. For instance, the middle embodiment of the connector 130 may comprise a silver reflector 300 and a solder intermediate layer 380. For instance, the right embodiment of the connector 130 may comprise an aluminum reflector, a nickel (or copper or gold) first intermediate layer 381, and a solder second intermediate layer 382.

As indicated above, an anti-reflection layer, indicated with reference 129, may be placed onto second luminescent body face 126 of the luminescent body 100. In embodiments, (side) surfaces may also comprise metallic (e.g. Al or Ag) or diffuse reflective (e.g. (particulate) $TiO_2$) comprising layers. Such layers may enhance reflectivity and may promote that (luminescent material) light may only escape from a desired face of the luminescent body 100. Such surface may essentially entirely be coated with such reflective material. However, in other embodiments similar reflective elements 300 may be applied to such other (side) surfaces (see also FIG. 6).

Figure 3A:
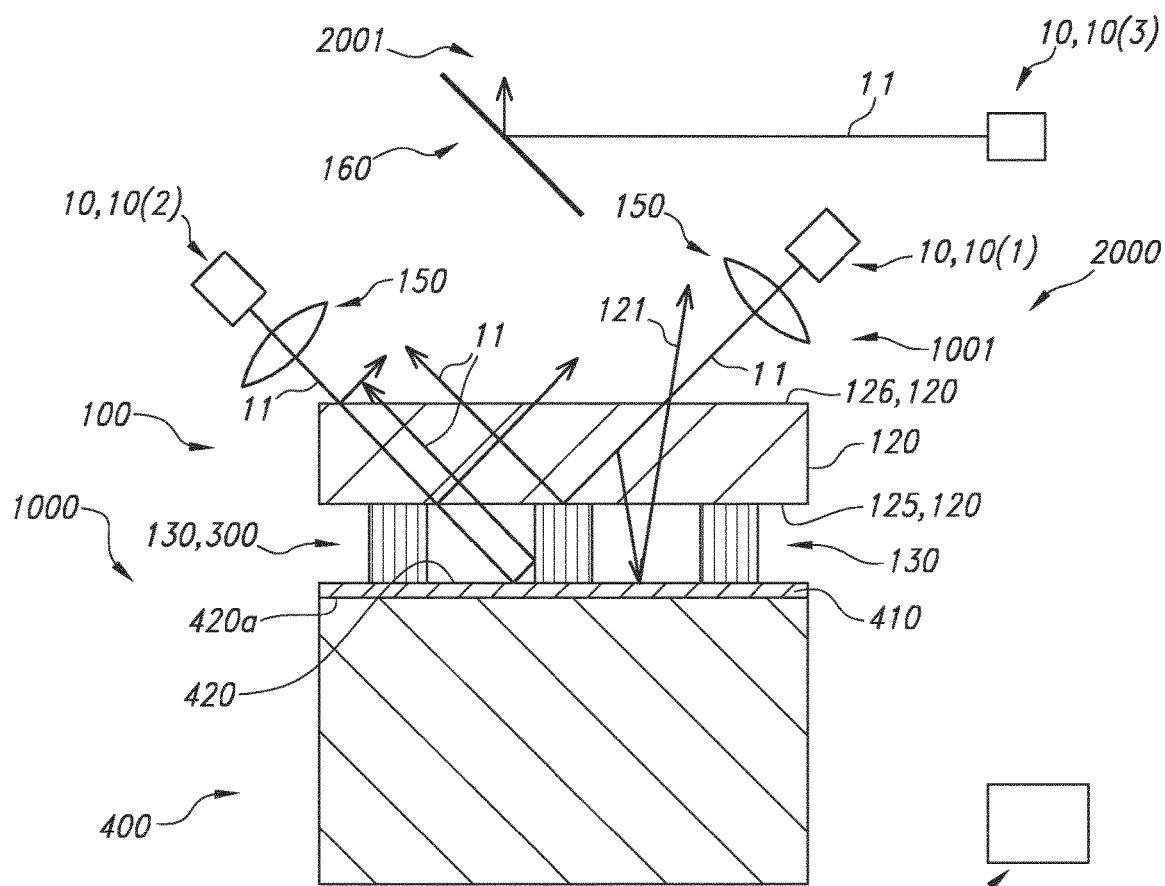

FIG. 3a schematically depicts an embodiment wherein the thermally conductive body 400 comprises a reflective layer 410. The reflective layer 410 defines the thermally conductive body face 420. Reference 420a indicates a face of the thermally conductive body on which the reflective layer 410 is provided. This reflective layer 410 on the thermally conductive body 400 may also be a silver layer.

The solder layer may have a thickness less than about 50 micron. Further, the solder may have a thermal conductivity of more than about 50 W/Km.

FIG. 3a also schematically depicts non-limiting embodiments of how light source light 11 may be admixed into the device light 2001. A second light source 10, indicated with reference 10(2), may provide light source light 11 having the same or different spectral power distribution as the light source light of a first light source 10(1). A third light source 10, indicated with reference 10(3) may provide light source light 11 having the same or different spectral power distribution as the light source light of a first light source 10(1) and/or the second light source 10(2). The configuration of the second light source 10(2), whereby at least part of its light source light 11 is introduced in the device light 2001 after reflection, scattering and/or transmission by the luminescent body 100, may provide for a better mixing of the second light source light (with the luminescent material light 201 and optionally first light source light) and/or may provide for excitation of e.g. another luminescent material comprised by the luminescent body 100 (that may have a higher absorption for the light source light of the second light source 10(2) than for the first light source 10(1)). The configuration of the third light source 10(3), of which its light source light 11 is admixed via a mirror 160 which is at least transparent for the luminescent material light 201 and/or the first light source light and/or the second light source light, and reflective for the third light source light, may provide light into the device light 2001 which cannot be absorbed or scattered by the luminescent body 100. Especially, at least one (type of) light source(s) 10 is configured to excite the luminescent material 200.

FIG. 3a also schematically depicts a control system 170, which may be configured to control one or more light sources 10.

Figure 3B:
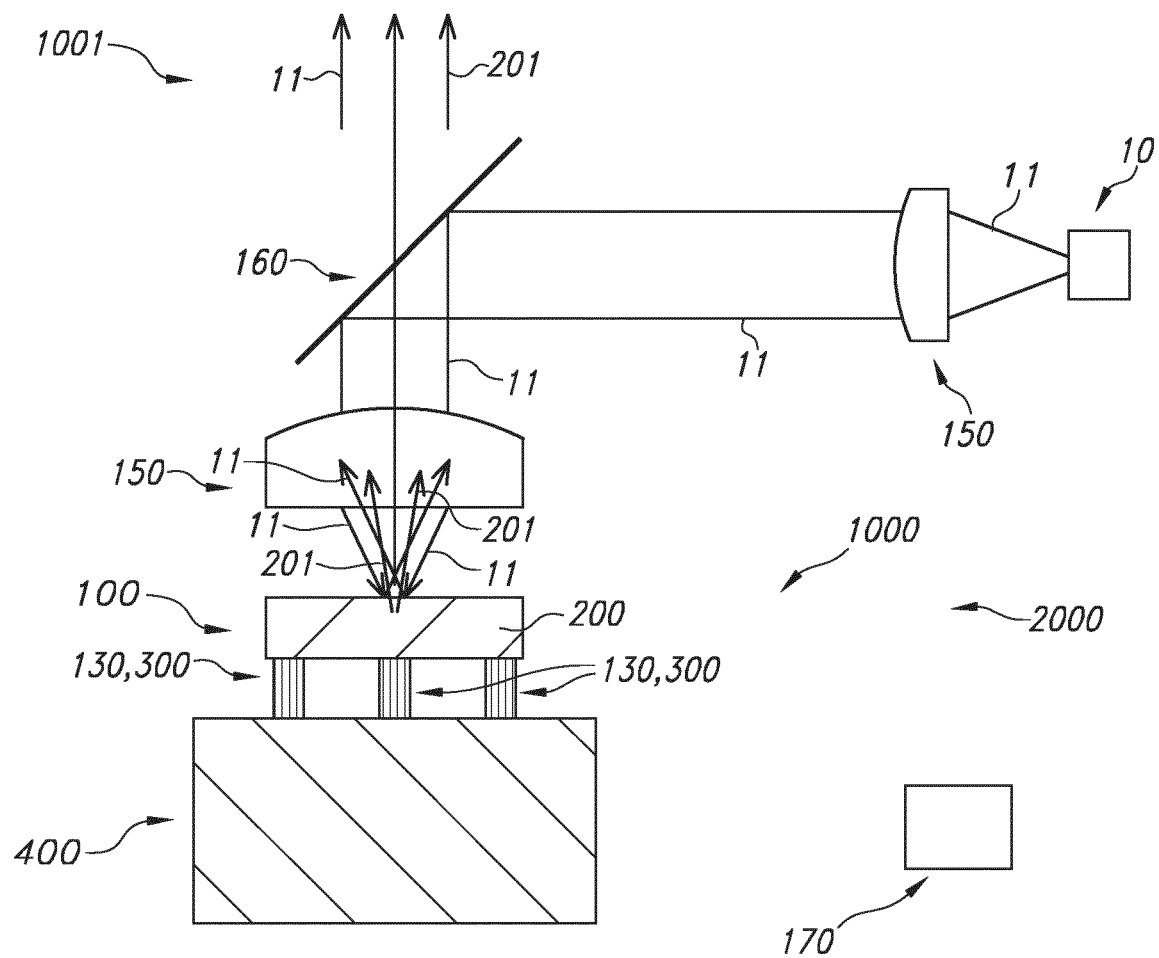

FIG. 3b schematically depicts a further embodiment. Here, via optics 150 light source light 11 is provided to the luminescent body 100. Via one or more of these optics 150 via which the light source light is provided, also luminescent material light 201. Here, (also) light source light 11 may be scattered and may be comprise by the device light 2001.

Figure 4:
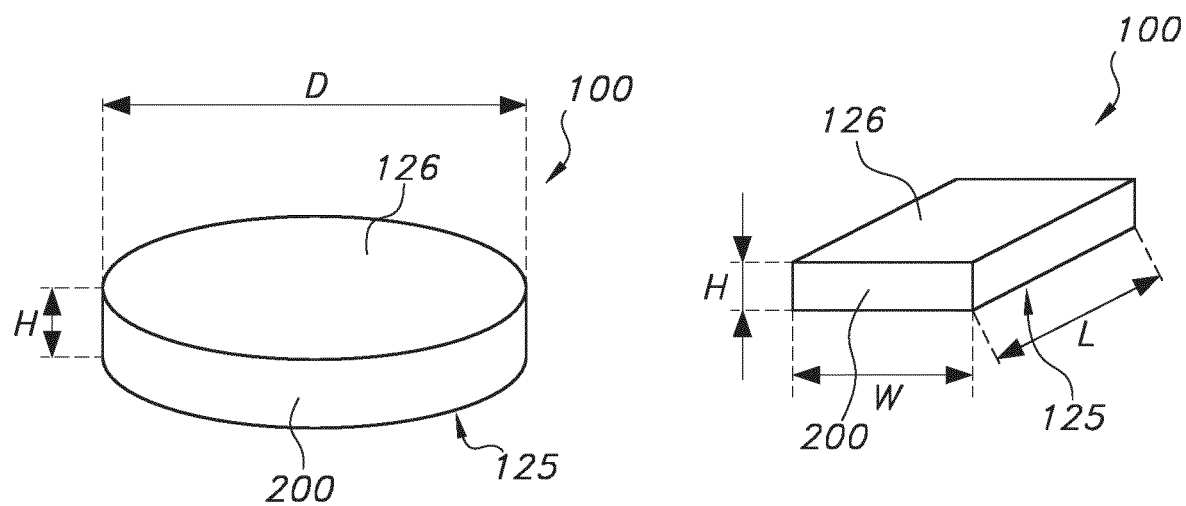

FIG. 4 schematically depict some possible embodiments of the luminescent body 100. The first luminescent material 200 may be provided as layer or body 100. The luminescent material may also be provided a layer or body comprising the luminescent material. The layer or body 100 may have dimensions selected from diameter D or length L and width W, and height H. First light source light may be provided to one of the sides with the relatively large area, i.e. to the circular side with diameter D in the left embodiment, or the top face or bottom face having an area W*L in the right embodiment.

In FIG. 4, on the right, an embodiment is depicted wherein the solid luminescent body 100 comprises an elongated light transmissive body. Especially, the solid luminescent body 100 is light transmissive for at least part of the luminescent material light. On the left, an embodiment is depicted wherein the luminescent body 100 has a disk like shape.

Figure 5A:
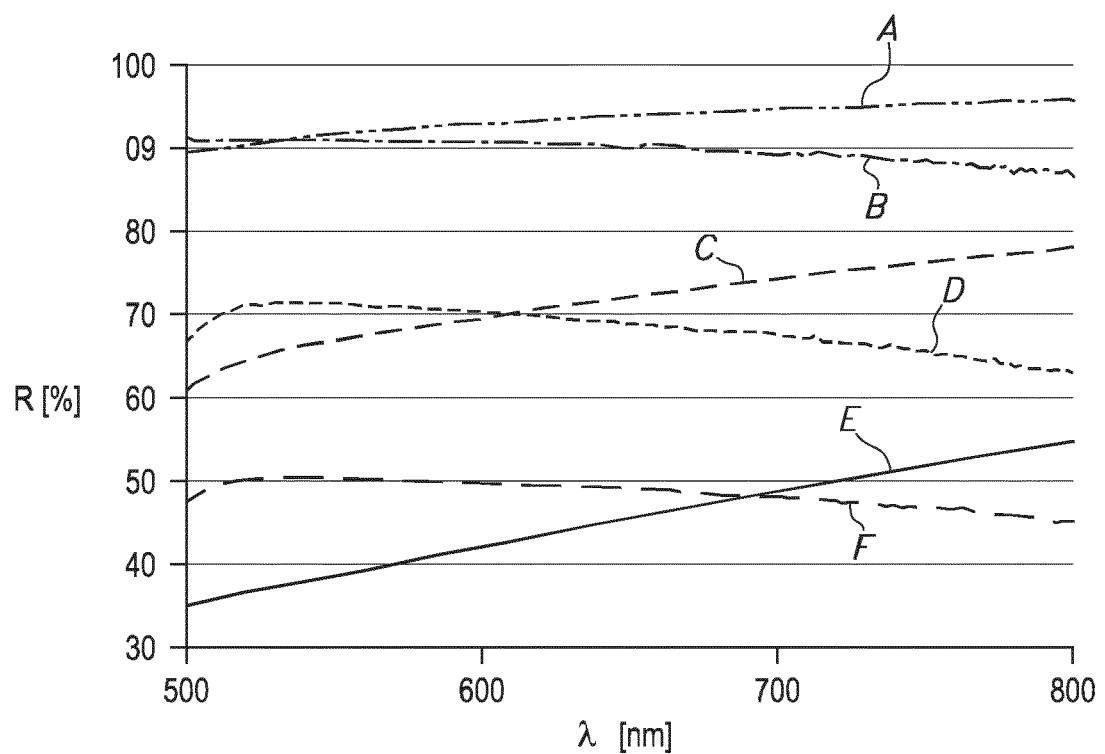
FIGS. 5a-5d depict some simulations.

In for instance FIG. 3b, it can be seen that for high efficiency light emitted by phosphor may especially be reflected while the heat produced by the phosphor may especially be efficiently transferred to the heat sink. Therefore, in embodiments a solution is provided wherein the ceramic phosphor is directly soldered to the heat sink. For this purpose, a reflecting layer may be deposited onto the phosphor which can be soldered to the heat sink. It was surprisingly found that reflectivity of a metallic layer such as aluminum or silver is significantly reduced when deposited onto a transparent ceramic phosphor layer such as Ce doped YAG or LuAG as shown in FIG. 5a. In this figure, it can be seen that the reflectivity of silver and aluminum are relatively high. However, when the metal is evaporated onto a YAG ceramic with a transparent and a smooth size and the reflectivity is measured through the YAG, a relatively large decrease in the reflectivity is observed. The decrease in the reflectivity becomes larger in the case where the deposited metal is on the rough side. Reference A indicates a silver mirror; reference B an Al mirror, reference C a silver mirror on the polished side of YAG, reference D indicates an Al mirror on the polished side of YAG; reference E indicates a silver mirror on the rough side of YAG and reference F indicates an Al mirror on the rough side of YAG. The reflectivities are measured as function of the wavelength.

Figure 5B:
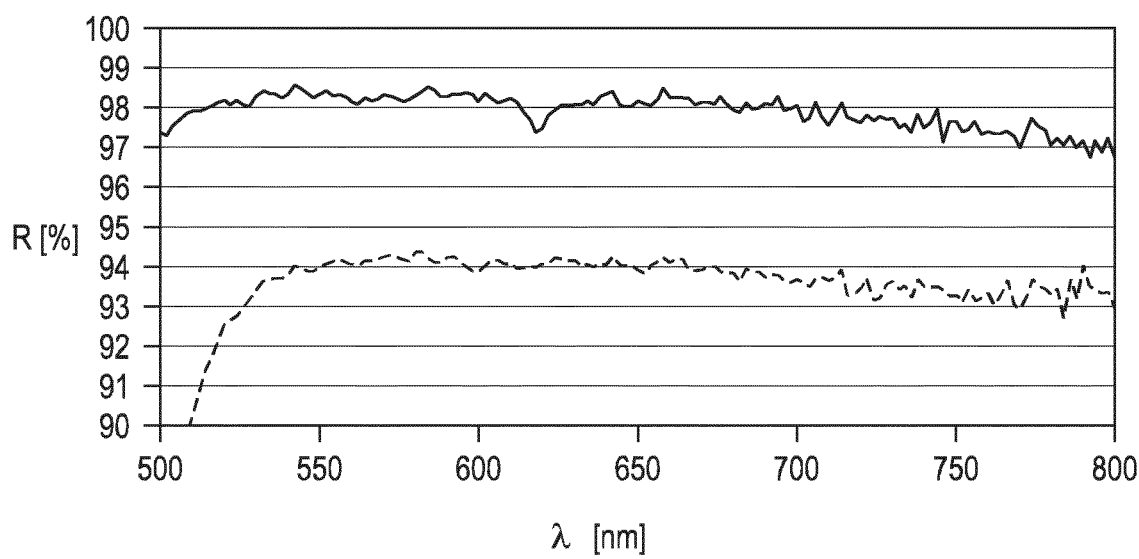

It was also observed that when the transparent ceramic is placed directly on a reflector, such an aluminum or a diffuse reflector such as alumina, with air in between the reflector and the transparent ceramic, only a slight decrease in the reflectivity was observed as shown in FIG. 5b. Here, the upper curve indicates the reflection Alanod (a silver reflector) and the lower curve indicates the reflection with YAG with an air gap in front of the Alanod reflector (wherein the reflection is measured through YAG) (i.e. an arrangement of YAG, air, Alanod, wherein the reflectivity of Alanod is measured through the YAG) as function of the wavelength.

As indicated above, in embodiments covering only a fraction of the phosphor with reflective metal for soldering onto a reflective heat sink is herein suggested. In the case of metallic heat sink, it might be desirable to provide it with a highly reflective metallic layer, like e.g. silver. In this way the size of the area with poor reflectivity may be minimized so that light from the areas without metal can go through the ceramic and get reflected from the heat sink for obtaining high reflectivity while there is good thermal contact between the heat sink and the soldered ceramic for providing good thermal management as schematically shown in e.g. the embodiments of FIGS. 1a-3b.

Figure 5C:
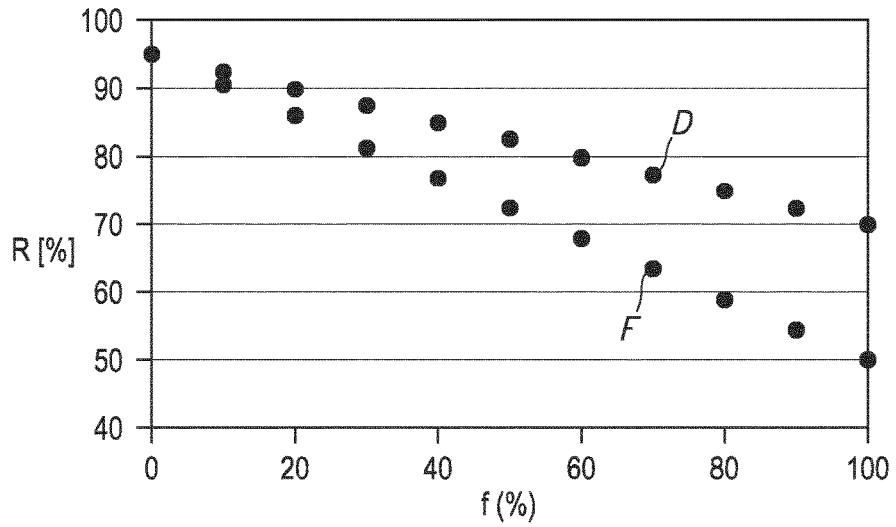

For example, aluminum and silver can be used as reflective layer. When silver is used soldering is not a problem however when aluminum is used extra layers of for example Ni and gold may be applied for making the reflective layer solderable. In FIG. 5c the effect on the total reflectivity is shown when layer with reflectivity from the combination of layers is plotted as a function of area (fraction f) on the phosphor covered by the evaporated reflector. Reference D indicates an Al mirror on the polished side of YAG; reference F indicates an Al mirror on the rough side of YAG. The reflectivities are measured as function of fraction f of coverage in % (of the face on which the reflective material is available).

Figure 5D:
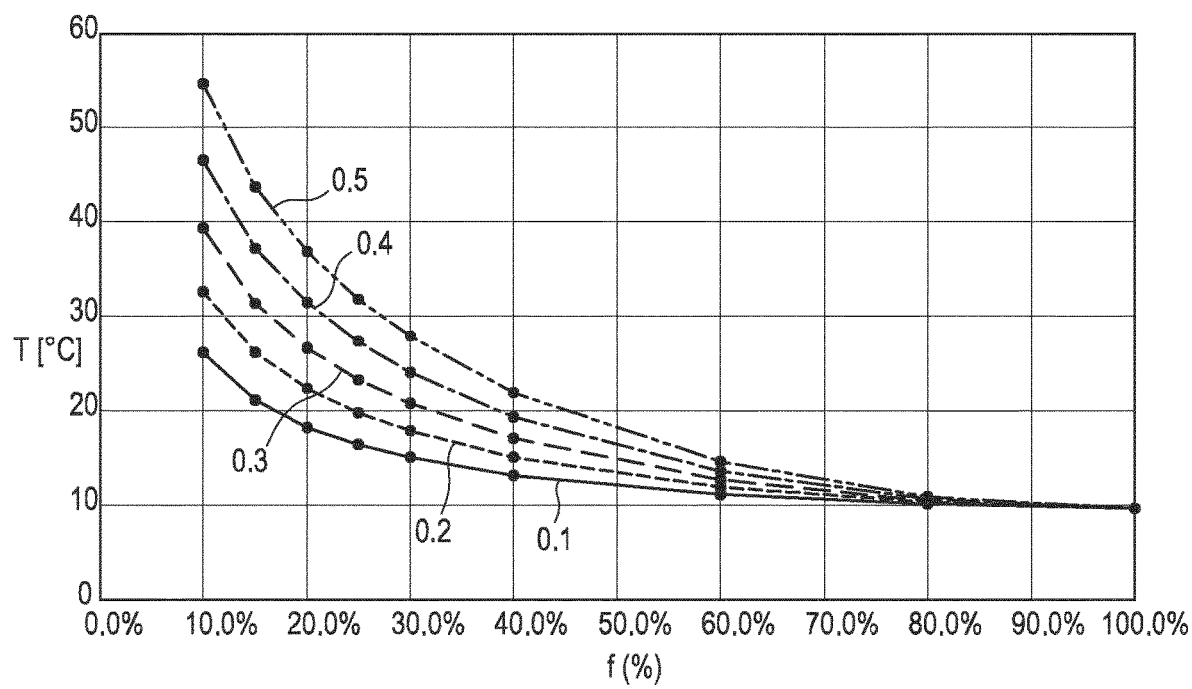

In FIG. 5d the average temperature of the ceramic phosphor is plotted as a function of solder coverage for various line pitches. In the modelling, the phosphor thickness t is assumed to be 0.1 mm with a thermal conductivity of k=10 W/mK. Thermal power of P=10 W/mm$^3$ is assumed to be generated in the phosphor layer and solder thickness of: t=0.05 mm, with a thermal conductivity of k=40 W/mK was used. Herein, P=10 W/mm$^3$ (thickness=0.1, P=1 W/mm$^2$) appears to be a typical value for the heat generation inside the volume of the ceramic phosphor when the laser energy is ~3 W/mm$^2$. The generated light power is in this example ~2 W/mm$^2$. Heatsink thickness: t=0.5 mm, with k=150 W/mK and at the bottom of the heat sink the temperature was assumed to be maintained at 0° C. This example assumes a heat sink or heat spreader made of aluminum. Most aluminum alloys for heat sink applications have a thermal conductivity between 150 and 230 W/mK. From the measurements, and e.g. FIG. 5d, it can be seen that when the pitch between the solder positions is less than about 200 μm the temperature over the whole surface of the phosphor is essentially uniform. Furthermore, when about a 100 μm pitch with about a 10-20% surface coverage is used a good heat sinking relative to full surface coverage can obtained. With only 10-20% surface coverage, the reflectivity is reduced only by 10-15%. The values 0.1-0.5 indicate the pitch in mm. The highest temperatures are with the largest pitch and the lowest temperatures with the smallest pitch.

Figure 6:
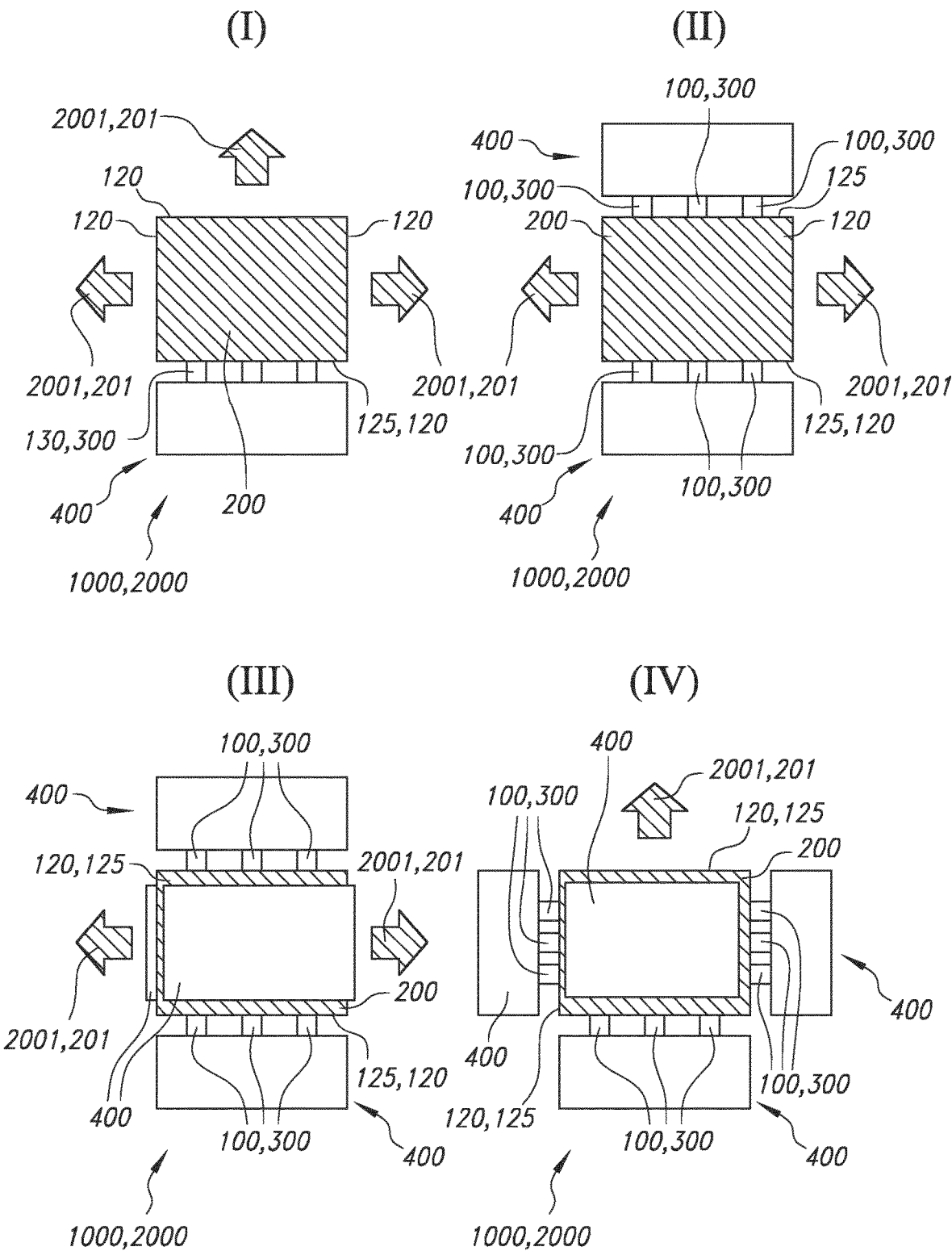
FIG. 6 schematically depicts yet some further embodiments. The schematic drawings are not necessarily to scale.

As indicated above, side surfaces may also comprise metallic (e.g. Al or Ag) or diffuse reflective (e.g. (particulate) TiO$_2$) comprising layers. Alternatively, more than one face of the body may be thermally coupled to a thermally conductive body. FIG. 6 schematically depict four possible embodiments (though more may be possible), assuming a cuboid shape (i.e. a cube or a rectangular cuboid (or rectangular hexahedron). Below, some possible features of the four embodiments are indicated:

|  | I | II | III | IV |
|---|---|---|---|---|
| sides | 6 | 6 | 6 | 6 |
| sides covered | 1 | 2 | 4 | 5 |
| e.g. | bottom | Bottom + top | Bottom + top + opposite sides | All sides but NOT top |
| Emission sides | 5 | 4 | 2 | 1 |
| emission | Many directions | Side emitter | Opposite directions | single direction |
| Reflective mode | + | − | − | + |
| Transmissive mode | − | + | + | − |
| Cooling performance | + | ++ | +++ | +++ |

Embodiment I may have as advantage that light emission from many directions may occur. This embodiment can be used in the reflective mode. Embodiment I may have as disadvantage a relatively lower cooling performance (when compared to the other three embodiments) and cannot be pumped from the bottom i.e. in transmissive mode. However, other transmissive modes (i.e. parallel to a first luminescent body face).

Embodiment II may have as advantage that light emission from many directions may occur. For instance, it may be a side emitter. Further, there may be good mechanical contact. This embodiment can be used in the reflective mode, though not from all sides.

Embodiment III may have as advantage that light emission may be from two (opposite) directions. This embodiment can be used in the reflective mode, but only in relation to two (smaller) faces). Embodiment III may have as a relatively high cooling performance (when compared to the embodiments I-II) and can thus not be pumped from the bottom i.e. in transmissive mode. In embodiment III, the N (side) faces are thermally coupled to thermally conductive bodies.

Embodiment IV may have as advantage that light emission may only occur from one direction. This embodiment can be used in the reflective mode. Embodiment IV may have an excellent cooling performance (when compared to the other three embodiments) but cannot be pumped from the bottom i.e. in transmissive mode. In embodiment III, the N+1 (side) faces are thermally coupled to thermally conductive bodies.

Similar principle may apply for a cylindric shape (i.e. one side surface) or an element having a pentagonal cross-section (5 side surfaces) or an element having a hexagonal cross-section (6 sides), etc.

The term "thermally conductive bodies" may also refer to a singly thermally conductive body (having different body parts, but forming a single body).

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A luminescent element comprising a solid luminescent body, wherein the solid luminescent body comprises a luminescent material, wherein the luminescent material is configured to generate luminescent material light upon excitation with light having a wavelength where the luminescent material is excitable, wherein the solid luminescent body comprises luminescent body faces, wherein the luminescent element further comprises one or more reflective elements associated to at least one luminescent body face, wherein the one or more reflective elements are metallic, and further comprising a thermally conductive body, wherein the thermally conductive body comprises a thermally conductive body face, wherein the thermally conductive body has a thermal conduction of at least 100 W/m/K, wherein the solid luminescent body is associated to the thermally conductive body face via the one or more reflective elements, and wherein a surface coverage of the at least one luminescent body face with the one or more reflective elements is selected from the range of 5-40%.

2. The luminescent element according to claim 1, wherein at any edge point (P) from one of the one or more reflective elements, in a plane parallel to the at least one luminescent body face to which the one of the one or more reflective elements are associated, a circle having a first radius r1 touches at least another part of the same reflective element or another part of another reflective element, wherein 10 µm≤r≤500 µm.

3. The luminescent element according to claim 1, comprising a plurality of n reflective elements, wherein n≥2, wherein the n reflective elements have a second shortest distance between nearest neighboring reflective elements, wherein the surface coverage is selected from the range of 10-20%, and wherein 20 µm≤d1≤300 µm.

4. The luminescent element according to claim 3, wherein n≤6, and wherein the second shortest distances are selected from the range of 50-200 µm.

5. The luminescent element according to claim 3, wherein one or more of the following applies: (i) the reflective elements are configured in a regular array, and (ii) n≥16, wherein the at least one luminescent body face has an edge and a geometrical center, wherein the reflective elements closer to the geometrical center have smaller shortest distances (d1) than reflective elements closer to the edge.

6. The luminescent element according to claim 1, wherein the one or more reflective elements comprise one or more of silver and aluminum.

7. The luminescent element according to claim 1, wherein the one or more reflective elements are obtainable by a method comprising one or more of vapor deposition and metal printing on the at least one luminescent body face.

8. The luminescent element according claim 1, wherein the solid luminescent body comprises a ceramic body, and wherein the luminescent material comprises $A_3B_5O_{12}$:Ce, wherein A comprises one or more of Y, La, Gd, Tb and Lu, and wherein B comprises one or more of Al, Ga, In and Sc, wherein at maximum 10% of B—O may be replaced by Si—N.

9. The luminescent element according to claim 1, wherein the solid luminescent body comprises an elongated light transmissive body, wherein the solid luminescent body is light transmissive for at least part of the luminescent material light.

10. The luminescent element according claim 1, further comprising intermediate elements between the one or more reflective elements and the thermally conductive body face.

11. The luminescent element according to claim 10, wherein a third distance (d3) between the solid luminescent body and the thermally conductive body face is selected from the range of 10-100 µm.

12. The luminescent element according to claim 10, wherein the intermediate elements comprise a first intermediate layer and a second intermediate layer wherein the first intermediate layer is in physical contact with the reflective element, and wherein the first intermediate layer comprises one or more of nickel, copper, gold, wherein the second intermediate layer is sandwiched between the first intermediate layer and the thermally conductive body face, wherein the second intermediate layer comprises solder, wherein the thermally conductive body comprises a reflective layer, wherein the reflective layer defines the thermally conductive body face.

13. A light generating device comprising the luminescent element according to claim 1 and a light source configured to generate light source light, wherein the luminescent material is configured in a light receiving relationship with the light source and is configured to convert at least part of the light source light into the luminescent material light.

14. The light generating device according to claim 13, wherein the luminescent body faces of the solid luminescent body comprise a first luminescent body face and a second luminescent body face, wherein the one or more reflective elements are associated to the first luminescent body face, and wherein the light source is radiatively coupled with the second luminescent body face.

15. The light generating device according to claim 13, wherein the light source comprises a laser light source, and wherein the light generating device further comprises the thermally conductive body.

* * * * *